US008400808B2

(12) United States Patent
King

(10) Patent No.: US 8,400,808 B2
(45) Date of Patent: Mar. 19, 2013

(54) PHASE INTERPOLATORS AND PUSH-PULL BUFFERS

(75) Inventor: Greg King, Hastings, MN (US)

(73) Assignee: Micron Technology, Inc., Boise, ID (US)

( * ) Notice: Subject to any disclaimer, the term of this patent is extended or adjusted under 35 U.S.C. 154(b) by 100 days.

(21) Appl. No.: 12/970,086

(22) Filed: Dec. 16, 2010

(65) Prior Publication Data

US 2012/0155142 A1 Jun. 21, 2012

(51) Int. Cl.
*G11C 5/06* (2006.01)
(52) U.S. Cl. .................................. 365/63; 365/189.05
(58) Field of Classification Search .............. 365/63, 365/189.05
See application file for complete search history.

(56) References Cited

U.S. PATENT DOCUMENTS

| | | | |
|---|---|---|---|
| 5,179,303 A * | 1/1993 | Searles et al. ................. 327/277 |
| 5,263,032 A | 11/1993 | Porter et al. ................. 371/40.2 |
| 5,774,475 A | 6/1998 | Qureshi | |
| 5,960,008 A | 9/1999 | Osawa et al. .............. 371/22.31 |
| 5,982,684 A | 11/1999 | Schwartzlow et al. | |
| 6,052,329 A | 4/2000 | Nishino et al. ................. 365/233 |
| 6,122,688 A | 9/2000 | Barth et al. .................... 710/100 |
| 6,181,616 B1 | 1/2001 | Byrd | |
| 6,247,138 B1 * | 6/2001 | Tamura et al. ................. 713/600 |
| 6,363,017 B2 | 3/2002 | Polney ..................... 365/189.02 |
| 6,401,213 B1 | 6/2002 | Jeddeloh | |
| 6,519,194 B2 | 2/2003 | Tsujino et al. ................. 365/201 |
| 6,574,626 B1 | 6/2003 | Regelman et al. ................. 707/6 |
| 6,650,157 B2 | 11/2003 | Amick et al. | |
| 6,882,304 B2 | 4/2005 | Winter et al. ................. 342/128 |
| 6,889,334 B1 | 5/2005 | Magro et al. | |
| 6,907,555 B1 | 6/2005 | Normura et al. .............. 714/719 |
| 7,058,865 B2 | 6/2006 | Mori et al. .................... 714/724 |
| 7,107,424 B1 | 9/2006 | Avakian et al. | |
| 7,135,905 B2 | 11/2006 | Teo et al. ........................ 327/231 |
| 7,149,134 B2 | 12/2006 | Streif et al. .................... 365/194 |
| 7,168,005 B2 | 1/2007 | Adams et al. ..................... 714/31 |
| 7,184,916 B2 | 2/2007 | Resnick et al. ............... 702/118 |
| 7,197,101 B2 * | 3/2007 | Glenn et al. .................. 375/373 |
| 7,203,259 B2 | 4/2007 | Glenn et al. .................. 375/354 |
| 7,389,375 B2 | 6/2008 | Gower et al. ................. 710/310 |
| 7,489,743 B2 | 2/2009 | Koh et al. ...................... 375/327 |
| 7,567,476 B2 | 7/2009 | Ishikawa ....................... 365/219 |
| 7,710,144 B2 | 5/2010 | Dreps et al. ..................... 326/30 |
| 7,979,757 B2 | 7/2011 | Jeddeloh ....................... 714/718 |
| 2002/0004893 A1 | 1/2002 | Chang | |

(Continued)

FOREIGN PATENT DOCUMENTS

JP 2007-140948 6/2007
WO WO-2007/038225 4/2007

(Continued)

OTHER PUBLICATIONS

Int. Search Report and Written Opinion for Appln No. PCT/US2011/062009 on Jul. 31, 2012.

*Primary Examiner* — Michael Tran
(74) *Attorney, Agent, or Firm* — Dorsey & Whitney LLP

(57) ABSTRACT

Interpolator systems are described utilizing one or more push-pull buffers to generate output clock signals that may be provided as inputs to a phase interpolator. The more linear slope on the output of the push-pull buffer may improve the linearity of a phase interpolator using the clock signals output from the push-pull buffers.

30 Claims, 8 Drawing Sheets

U.S. PATENT DOCUMENTS

| | | | |
|---|---|---|---|
| 2002/0054516 A1 | 5/2002 | Taruishi et al. | |
| 2002/0097613 A1 | 7/2002 | Raynham | 365/200 |
| 2002/0125933 A1 | 9/2002 | Tamura et al. | |
| 2002/0130687 A1 | 9/2002 | Duesman | 326/101 |
| 2002/0133666 A1 | 9/2002 | Janzen et al. | |
| 2002/0138688 A1 | 9/2002 | Hsu et al. | 711/105 |
| 2003/0041299 A1 | 2/2003 | Kanazawa et al. | 714/766 |
| 2003/0132790 A1* | 7/2003 | Amick et al. | 327/158 |
| 2004/0073767 A1 | 4/2004 | Johnson et al. | 711/202 |
| 2004/0160833 A1 | 8/2004 | Suzuki | 365/194 |
| 2004/0168101 A1 | 8/2004 | Kubo | 714/6 |
| 2004/0199840 A1 | 10/2004 | Takeoka et al. | 714/727 |
| 2004/0206982 A1 | 10/2004 | Lee et al. | 257/200 |
| 2004/0237023 A1 | 11/2004 | Takahashi et al. | 714/768 |
| 2004/0246026 A1 | 12/2004 | Wang et al. | 326/86 |
| 2005/0091471 A1 | 4/2005 | Conner et al. | 711/220 |
| 2005/0144546 A1 | 6/2005 | Igeta et al. | 714/735 |
| 2005/0157560 A1 | 7/2005 | Hosono et al. | 365/185.22 |
| 2005/0278490 A1 | 12/2005 | Murayama | |
| 2006/0126369 A1 | 6/2006 | Raghuram | |
| 2006/0233012 A1 | 10/2006 | Sekiguchi et al. | 365/51 |
| 2006/0245291 A1 | 11/2006 | Sakaitani | 365/230.03 |
| 2006/0273455 A1 | 12/2006 | Williams et al. | |
| 2007/0058410 A1 | 3/2007 | Rajan | 365/63 |
| 2007/0070669 A1 | 3/2007 | Tsern | |
| 2007/0074093 A1 | 3/2007 | Lasser | 714/763 |
| 2007/0136645 A1 | 6/2007 | Hsueh et al. | 714/784 |
| 2007/0271424 A1 | 11/2007 | Lee et al. | 711/156 |
| 2008/0147897 A1 | 6/2008 | Talbot | 710/8 |
| 2008/0250292 A1 | 10/2008 | Djordjevic | 714/746 |
| 2009/0006775 A1 | 1/2009 | Bartley et al. | 711/154 |
| 2009/0016130 A1 | 1/2009 | Menke et al. | 365/201 |
| 2009/0196093 A1 | 8/2009 | Happ et al. | 365/163 |
| 2009/0300314 A1 | 12/2009 | LaBerge et al. | 711/167 |
| 2009/0300444 A1 | 12/2009 | Jeddeloh | 714/719 |
| 2010/0005217 A1 | 1/2010 | Jeddeloh | 711/1 |
| 2010/0005376 A1 | 1/2010 | LaBerge et al. | 714/819 |
| 2010/0014364 A1 | 1/2010 | LaBerge et al. | 365/193 |
| 2010/0031129 A1 | 2/2010 | Hargan | 714/786 |
| 2010/0042889 A1 | 2/2010 | Hargan | 714/752 |
| 2010/0070696 A1 | 3/2010 | Blankenship | 711/105 |
| 2010/0079180 A1 | 4/2010 | Kim et al. | |
| 2010/0091537 A1 | 4/2010 | Best et al. | 365/51 |
| 2010/0110748 A1 | 5/2010 | Best | 365/51 |
| 2011/0075497 A1 | 3/2011 | LaBerge et al. | 365/193 |
| 2011/0296227 A1 | 12/2011 | LaBerge et al. | |
| 2012/0144276 A1 | 6/2012 | Hargan | |

FOREIGN PATENT DOCUMENTS

| | | |
|---|---|---|
| WO | WO-2008/054696 | 5/2008 |
| WO | WO-2010/002561 A2 | 1/2010 |
| WO | WO-2010/011503 A2 | 1/2010 |

\* cited by examiner

US 8,400,808 B2

PHASE INTERPOLATORS AND PUSH-PULL BUFFERS

TECHNICAL FIELD

Embodiments of the invention relate generally to electronic circuitry. Examples described include phase interpolators and buffers.

BACKGROUND

Phase interpolators may be used to provide phase control of a clock signal. A phase interpolator receives multiple input clock signals, each having a different phase. The phase interpolator mixes two of the incoming clock phases to generate an output clock signal having a programmable phase. For example, two input clock signals may be provided to a phase interpolator, one having a 0 degree phase, and one having a 90 degree phase. The phase interpolator may then output a clock signal having a phase between 0 and 90 degrees. The phase interpolator includes a mixer which may weigh the input clock signals and combine them to generate the output signal having the programmable phase.

For a larger range, a phase interpolator may select between multiple input signals. For example, input clock signals having a 0 degree phase, a 90 degree phase, a 180 degree phase, and a 270 degree phase may be available to a phase interpolator. A selector may be provided to select the input clock signals provided to the phase interpolator. When the 0 degree phase and 90 degree phase signals are selected, the phase interpolator may generate an output clock signal having a programmable output phase between 0 and 90 degrees. When the 90 degree phase and 180 degree phase input signals are selected, the phase interpolator may generate an output clock signal having a programmable output phase between 90 and 180 degrees.

One metric used to describe phase interpolators is their linearity. To improve the linearity of the placement of the phase of the programmable output clock signal, current mode logic buffers have been used to provide the input clock signals to a phase interpolator circuit containing a buffer. The current mode logic buffers may improve the linearity of operation of the phase interpolator circuit.

FIG. 1 is a schematic illustration of a current mode logic buffer. The current mode logic buffer 100 may receive a differential clock signal, INN and INP and output a differential output signal OUTN and OUTP. The INN and INP input clock signals may be provided to gates of n-FET transistors 105 and 107 respectively. Load resistors 110 and 112 are coupled to drain terminals of the transistors 105 and 107, respectively. A transistor 120 is coupled to the source terminals of the transistors 105 and 107. The transistor 120 receives a bias voltage BN at its gate terminal and may draw a corresponding amount of current from the transistors 105 and 107.

The INP signal may turn on the transistor 107, allowing current flow through the resistor 112 and generating the OUTN signal. The INN signal may turn on the transistor 105, allowing current flow through the resistor 110 and generating the OUTP signal.

FIG. 2 is an example graph illustrating an output signal from a current mode logic buffer. The graph illustrates the voltage of the OUTN signal over time. The resistances 112 and 110 of the current mode logic buffer 100 in FIG. 1 create an RC effect on the output waveform. The output signal 210 is illustrated in FIG. 2, and the RC effect generated by the resistances 112 and 110 can be seen by the variation in slope of the output signal.

DETAILED DESCRIPTION

Certain details are set forth below to provide a sufficient understanding of embodiments of the invention. However, it will be clear to one skilled in the art that embodiments of the invention may be practiced without various of these particular details. In some instances, well-known circuits, control signals, timing protocols, and software operations may not have been shown in detail in order to avoid unnecessarily obscuring the described embodiments of the invention.

Clock signals are described below, and generally refer to a periodic signal having a duty cycle. Phases of clock signals are also described below. A phase of a clock signal generally refers to the timing of a peak or rising edge of the signal. 0, 90, 180, and 270 degree signals may be described, which generally refer to the position of the peak or rising edge of the signal relative to the entire clock period. For example, a clock signal having a 90 degree phase may generally having a rising edge or peak which is offset by ¼ of a clock period from a starting measurement point.

As described above, current mode logic buffers have been used to generate output signals that may be provided to an input of a phase interpolator. The RC effect on the output signal, however, may be undesirable because of the variation in slope of the signal over time, which may contributed to non-linear behavior of a phase interpolator.

Embodiments of the present invention utilize one or more push-pull buffers to generate output clock signals that may be provided as inputs to a phase interpolator. The more linear slope on the output of the push-pull buffer, relative to that of the current mode logic buffers described above, may improve the linearity of a phase interpolator using the clock signals output from the push-pull buffers.

Figure 3:
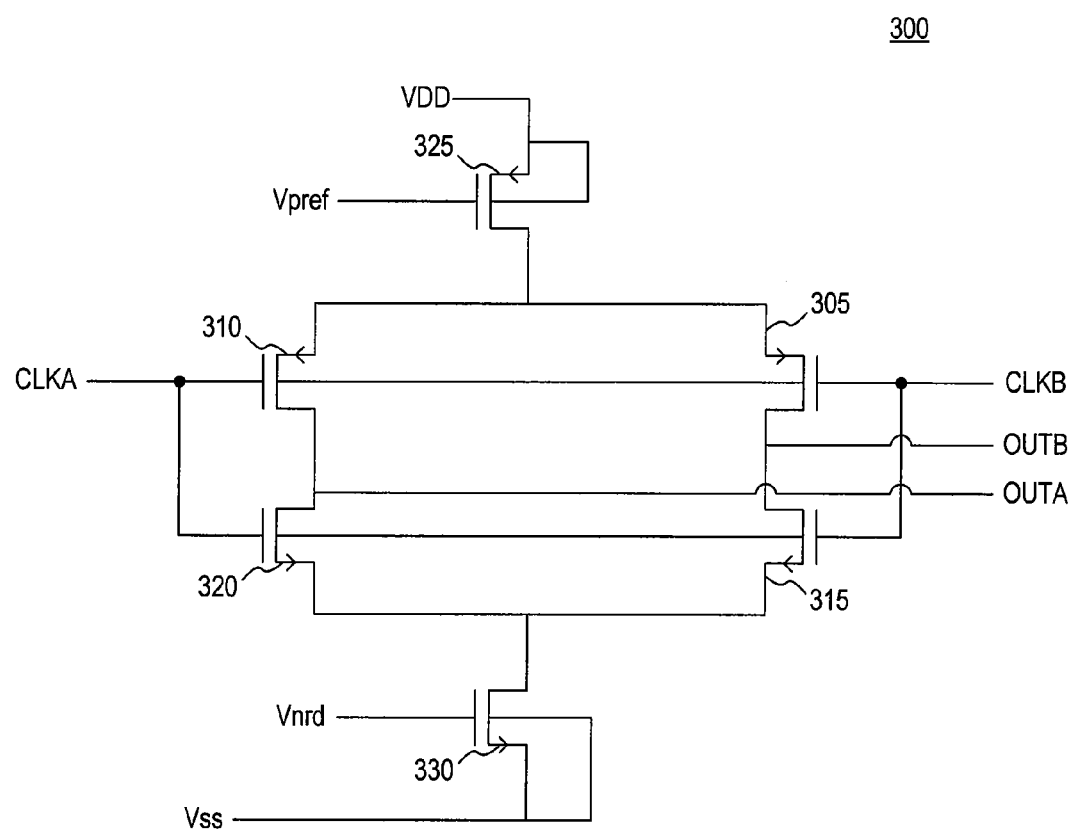
FIG. 3 is a schematic illustration of a push-pull buffer.

FIG. 3 is a schematic illustration of a push-pull buffer. The push-pull buffer 300 includes a pair of p-FET transistors 305, 310 coupled to a pair of n-FET transistors 315, 320. The drain terminal of the p-FET transistor 310 is coupled to the drain terminal of the n-FET transistor 320. The drain terminal of the p-FET transistor 305 is coupled to the drain terminal of the n-FET transistor 315. The source terminals of the p-FET transistors 310 and 305 are coupled to one another and to a current source. The current source is implemented by a p-FET transistor 325 having its drain terminal coupled to the source terminals of the p-FET transistors 305 and 310. A bias voltage, $V_{pref}$, is provided to the gate terminal of the p-FET transistor 325 to turn on the p-FET transistor 325 and provide a current. The source terminals of the n-FET transistors 315 and 320 are coupled to one another and to another current source. The current source is implemented by an n-FET transistor 330 having its drain terminal coupled to the source terminals of the n-FET transistors 315 and 320. A bias voltage, $V_{nref}$, is provided to the gate terminal of the n-FET transistor 330 to turn the transistor on and provide a current.

Differential input clock signals, CLKA and CLKB, may be provided to inputs of the push-pull buffer 300. The CLKA signal may be provided to the gate terminals of the p-FET transistor 310 and the n-FET transistor 320. The CLKB signal may be provided to the gate terminals of the p-FET transistor 305 and the n-FET transistor 315. A differential output signal may be generated by the push-pull buffer 300. The differential output signal OUTA may be generated at the drain terminals of the transistors 310 and 320. The differential output signal OUTB may be generated at the drain terminals of the transistors 305 and 315.

Figure 2:
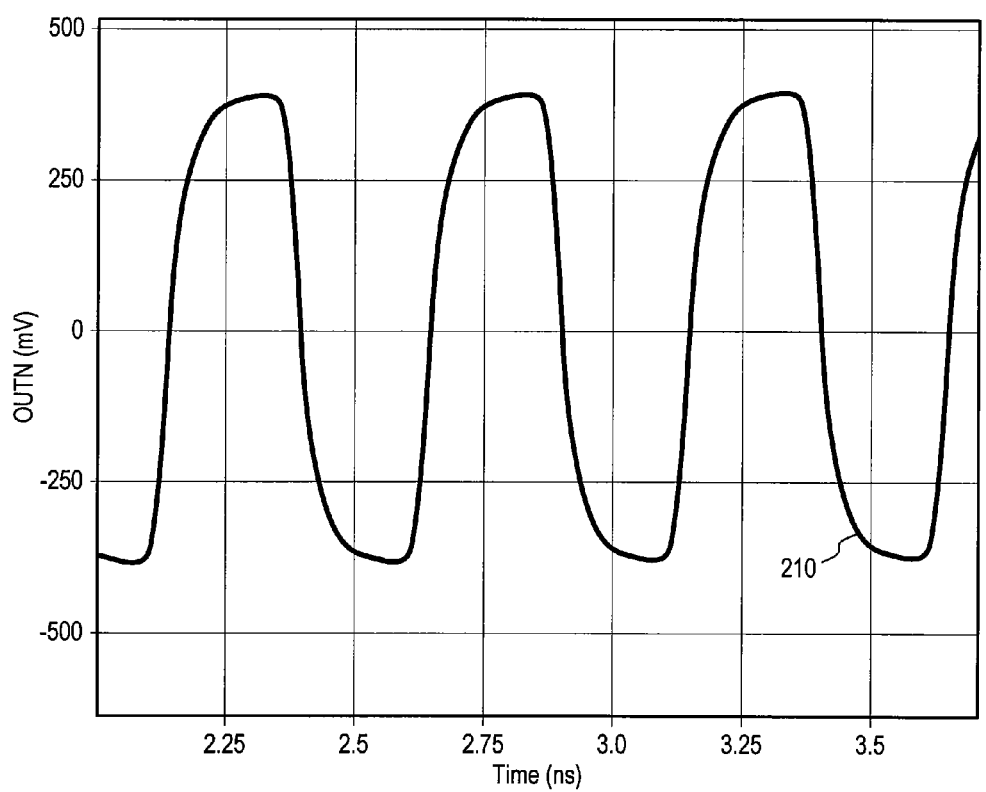
FIG. 2 is an example graph illustrating an output signal from a current mode logic buffer.
Figure 4:
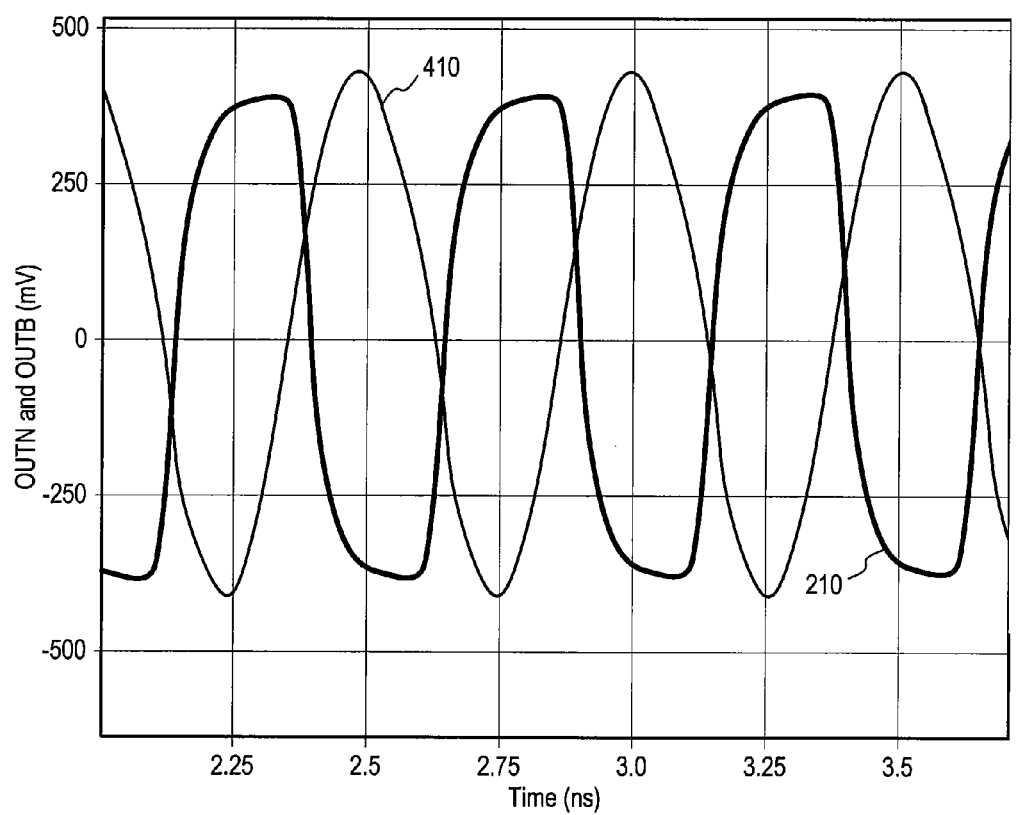
FIG. 4 is an example graph illustrating an output signal from a current mode logic buffer and a push-pull buffer.

FIG. 4 is an example graph illustrating an output signal from a current mode logic buffer and a push-pull buffer. The signal from the current mode logic buffer 210, is the same as described above with regard to FIG. 2. An output signal from the push-pull buffer 410, which may correspond to the signal OUTB of FIG. 3, is also illustrated. Due in part to the use of both n-FET and p-FET pairs of transistors, the push-pull buffer output signal 410 has a more constant slope. The use of both n-FET and p-FET transistor pairs in the push-pull buffer 300 shown in FIG. 3 may allow for a fixed current output that may provide constant drive strength over the output swing.

Figure 5:
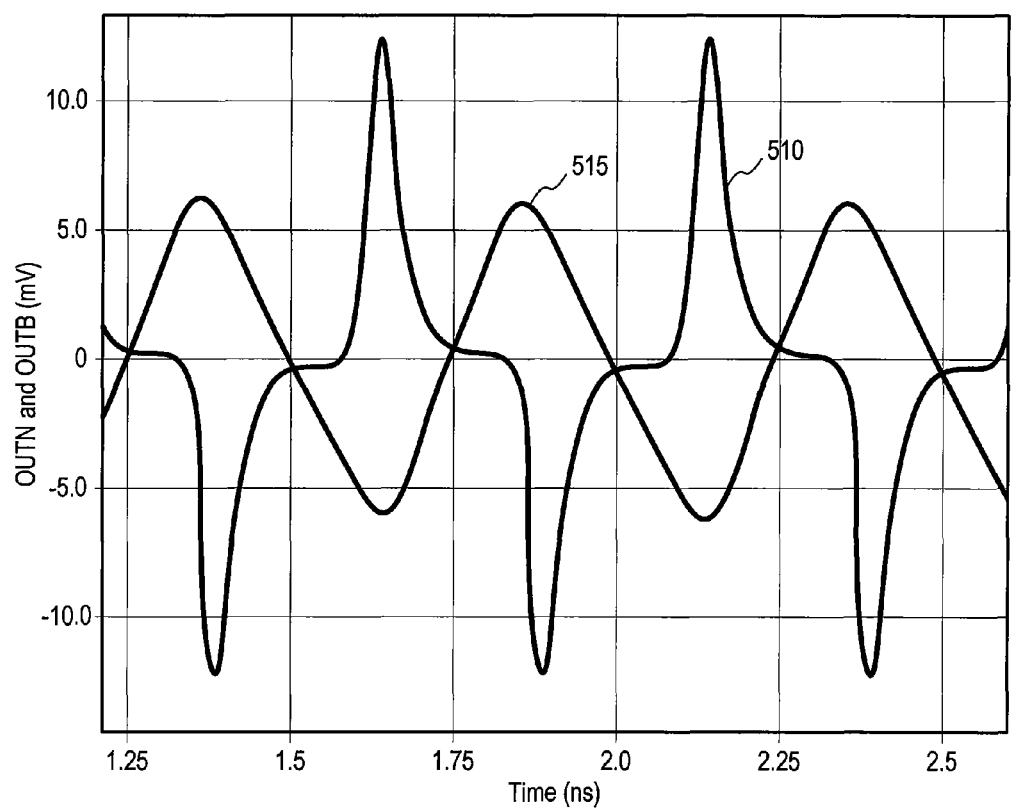
FIG. 5 is an example graph illustrating the slope of the current mode logic buffer and push-pull buffer output signals of FIG. 4.

FIG. 5 is an example graph illustrating the slope of the current mode logic buffer and push-pull buffer output signals of FIG. 4. The line 510 illustrates the slope of the current mode logic buffer output signal 201 of FIGS. 2 and 4. As shown in FIG. 5, the slope 510 may contain significant non-linearities. The discontinuity in the slope may be caused in part by the RC component imposed by the load resistors in current mode buffer circuits, as has been described above. In contrast, the line 515 illustrates the slope of the push-pull buffer output signal 410 of FIG. 4. The line 515 exhibits greater linearity than the line 510. Accordingly, the output of a push-pull buffer circuit may be advantageous for providing a signal to a phase interpolator by improving the linearity of the phase interpolator.

Figure 6:
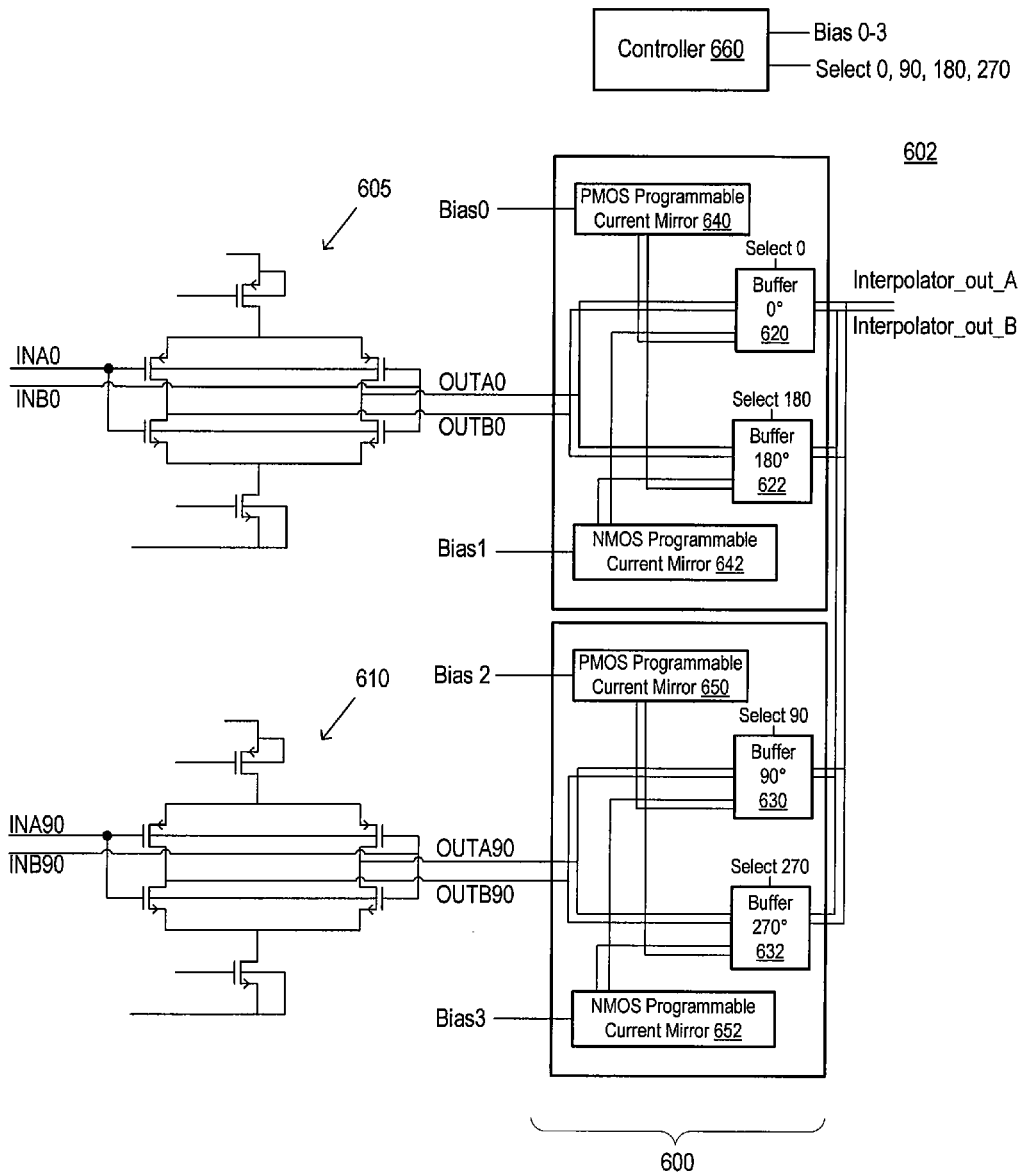
FIG. 6 is a schematic illustration of an interpolator system.

FIG. 6 is a schematic illustration of an interpolator system 602. Two push-pull buffers 605 and 610 are coupled to an interpolator 600. The push-pull buffers 605 and 610 may be implemented using the push-pull buffer shown in FIG. 3, for example. Referring back to FIG. 6, the output of the push-pull buffer 605 is coupled to a first input of the interpolator 600. The output of the push-pull buffer 610 is coupled to another input of the interpolator 600. The interpolator 600 is configured to mix the signals received from the push-pull buffers 605 and 610 to generate an output signal having a programmable phase based on the phases of the signals received from the buffers 605 and 610. The push-pull buffer 605 may receive a clock signal having a 0 degree phase—INA0 and INB0 in FIG. 6. The push-pull buffer 605 may generate output clock signals having a 0 degree phase—OUTA0 and OUTB0 in FIG. 6. The push-pull buffer 610 may receive a clock signal having a 90 degree phase—INA90 and INB90 in FIG. 6. The push-pull buffer 610 may generate output clock signals having a 90 degree phase—OUTA90 and OUTB90 in FIG. 6. In this manner, the interpolator 600 may receive a first set of signals (OUTA0 and OUTB0) having a 0 degree phase and a second set of signals (OUTA90 and OUTB90) having a 90 degree phase. Although 0 and 90 degree phases are used here as examples of two clock phases which may be received, any phases may be used.

Each pair of clock signals received by the interpolator 600 may be provided to two buffers, with opposite polarity used to provide the signals to one of the buffers. So, for example, the OUTA0 and OUTB0 signals are provided to buffers 620 and 622 in FIG. 6. The OUTA0 and OUTB0 signals are provided with opposite polarity to the buffer 622 as to the buffer 620. Accordingly, the buffer 620 may generate output signals having a 0 degree clock phase, while the buffer 622 may generate output signals having a 180 degree clock phase. Accordingly, output signals having 0, 90, 180, and 270 degree phases may be used to generate an output signal having programmable phase, as will be described further below. Although 0, 90, 180, and 270 degree phases have been used in this example, a greater number, or fewer, clock phases may be used in other embodiments. Moreover, different clock phases may be used.

The OUTA90 and OUTB90 signals are provided to buffers 630 and 632 in FIG. 6. Accordingly, the buffer 630 may generate output signals having a 90 degree clock phase, while the buffer 632 may generate output signals having a 270 degree clock phase. The buffers 620, 622, 630, and 630 receive control (e.g. select) signals corresponding to a selection of which buffers are activated. The buffer 620 may be activated responsive to receipt of a select0 signals. The buffer 622 may be activated responsive to receipt of a select 180 signal, the buffer 630 may be activated responsive to receipt of a select90 signal, and the buffer 632 may be activated responsive to receipt of a select270 signal. Typically, either the buffer 620 or 622 is activated and either the buffer 630 or 632 is activated by the appropriate control signals. This may allow for a range of mixed output signals. For example, if the buffer 620 and the buffer 630 are activated, the output of the interpolator 600 may be a signal having a programmable phase between 0 and 90 degrees. If the buffer 630 and the buffer 622 are activated, the output of the interpolator 600 may be a signal having a programmable phase between 90 and 180 degrees. If the buffers 622 and 632 are activated, the output of the interpolator 600 may be a signal having a programmable phase between 180 and 270 degrees. If the buffers 620 and 632 are activated, the output of the interpolator 600 may be a signal having a programmable phase between 270 and 0 degrees. The interpolator output signals are shown is Interpolator_out_A and Interpolator_out_B in FIG. 6.

The output phase of the Interpolator_out_A and Interpolator_out_B signals may be programmed by selecting an amount of current provided by p-FET and n-FET programmable current mirrors 640, 642, 650, and 652. The p-FET current mirror 640 may provide a current to the buffers 620 and 622 responsive to a control signal, such as the bias0 signal. The n-FET current mirror 642 may provide a current to the buffers 620 and 622 responsive to another control signal, such as the bias1 signal. The p-FET current mirror 650 may provide a current to the buffers 630 and 632 responsive to the bias2 signal. The n-FET current mirror 652 may provide a current to the buffers 630 and 632 responsive to the bias3 signal. Recall under typical conditions either the buffer 620 or the buffer 622 will be active and either the buffer 630 or 632 will be active. The bias0-3 signals are typically generated such that as the currents provided to the buffers 620 and 622 increase, the currents provided to the buffers 630 and 632 decrease. That is, a sum of current provided to the buffer 620 or 622 and that provided to the buffer 630 or 632 may generally be constant, so the current serves as a weighting. The more current provided to the buffer 620 or 622, the closer the output signal will be to 0 or 180 degrees, respectively. Conversely, the more current provided to the buffer 630 or 632, the closer the output signal will be to 90 or 270 degrees, respectively. In this manner, the phase of the output signal may be programmed.

The buffers 620, 622, 630, and 632 may have a similar push-pull structure to the buffers 605 and 610. That is, the buffers 620, 622, 630, and 632, may each include at least one p-FET and one n-FET transistor, such as the transistors 305, 310, 315, and 320 of FIG. 3. This may allow for the advantageous linear properties of the push-pull buffer to be provided to the interpolator output signal. Similarly, the p-FET programmable current mirrors 640, 650 may be implemented using, for example, the transistor 325 of FIG. 3. The n-FET programmable current mirrors 642, 652, may be implemented using, for example, the transistor 330 of FIG. 3.

A controller 660 may generate the bias0-3 signals and the select signals applied to the interpolator 600. Although four bias signals and four select signals are shown, one for each buffer and each programmable current mirror, in other examples, the buffers and programmable current mirrors may share select or bias signals, or the select or bias signals may be generated by circuitry (e.g. logic gates) coupled between the controller 660 and the buffers or current mirrors. In some examples, current sources other than current mirrors may be used.

Figure 1:
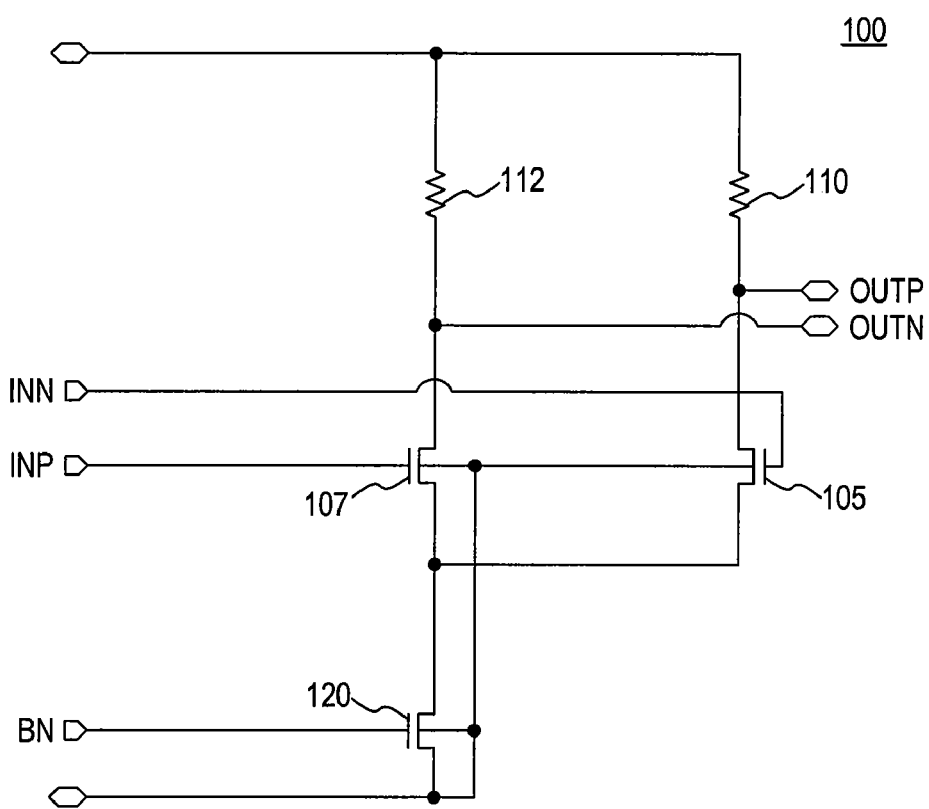
FIG. 1 is a schematic illustration of a current mode logic buffer.

Embodiments of the present invention may advantageously have reduced variation over different process corners, and in some examples the reduced variation is reduced as compared with standard interpolators employing current mode logic buffers, described above with reference to FIG. 1. Interpolators employing current mode logic buffers may require that the edge rates be reduced to maintain enough linearity in the interpolator. Edge rates are typically delayed by delaying slew rates of a current mode logic buffer using loading capacitors on the output of the current mode logic buffer. These loading capacitors may increase the RC effect on the output signal, which, as described above, has a deleterious effect on the linearity of the interpolator. Further, the capacitors require semiconductor chip area and power. Embodiments of interpolators using push-pull buffers, as described above, may not require loading capacitors, reducing the required chip area and power, and further improving linearity.

Interpolators according to embodiments of the present invention may be used in any of a variety of application where a periodic signal having a programmable output phase is desired. Interpolators according to embodiments of the present invention may be used, for example, to sweep a strobe signal across data and/or measure an opening of an eye diagram. Interpolators may accordingly be used in tester chips, for example. In other examples, interpolators according to embodiments of the present invention may be used in serial links where one chip may receive data from another chip. The serial link should clock incoming data at a center of an incoming data eye. A phase interpolator may be used to generate and/or adjust the clock signal used to clock incoming data. In some examples, the data eye may be small, such as 100 ps or less at 10 GB/s operating rates, accordingly, phase interpolator linearity may be advantageous.

Figure 7:
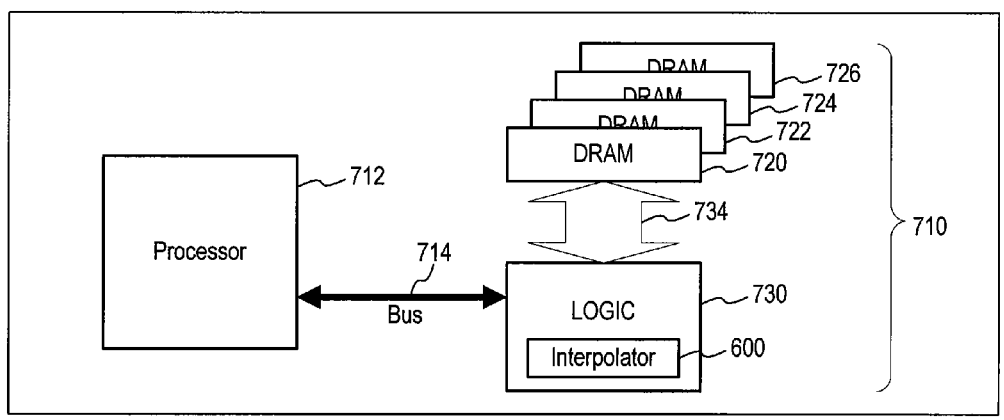
FIG. 7 is a schematic illustration of a portion of a computer system.

Embodiments of interpolators according to embodiments of the present invention may be used in memory systems, and for example, in memory systems including stacked memory chips. FIG. 7 is a schematic illustration of a portion of a computer system 700. A memory device 710 may be coupled to a processor 712 through a bus 714 which may be divided into downstream lanes and upstream lanes (not shown in FIG. 7). The memory device 710 may include 4 memory die 720, 722, 724, 726, which may be identical to each other, stacked on top of each other. The memory die 720, 722, 724, and 726 may be coupled to one another using, for example, conductive through-wafer interconnects. Although the memory device 710 as shown includes 4 memory die, any number may be used. The memory die 720, 722, 724, 726 may be stacked on top of a logic die 730, which may serve as the interface with the processor 712. The logic die 730 may implement a variety of functions including, but not limited to, memory management functions, such as power management and refresh of memory cells in the memory die 720, 722, 724, 726. In some embodiments, the logic die 730 may implement test and/or repair capabilities. The logic die 730 may include one or more interpolator systems as described herein, such as the interpolator system 602. The interpolator may be used, for example, to clock the bus 714 between the processor 712 and the logic die 730. The controller 660 shown in FIG. 6 may also be included on the logic die 730.

The memory die 720, 722, 724, 726 may be connected to each other and to the logic die 730 by a bus 734. The bus 34 may be implemented with, for example, through-wafer interconnects such as through silicon vias ("TSVs"), which may include a large number of conductors extending through the memory die 720, 722, 724, 726 at the same locations on the memory die and connect to respective conductors formed on the die 720, 722, 724, 726. In one embodiment, each of the memory die 720, 722, 724, 726 may be divided into 16 autonomous partitions, each of which may contain 2 or 4 independent memory banks. In such case, the partitions of each die 720, 722, 724, 726 that are stacked on top each other may be independently accessed for read and write operations. Each set of 16 stacked partitions may be referred to as a "vault." Thus, the memory device 710 may contain 16 vaults.

Figure 8:
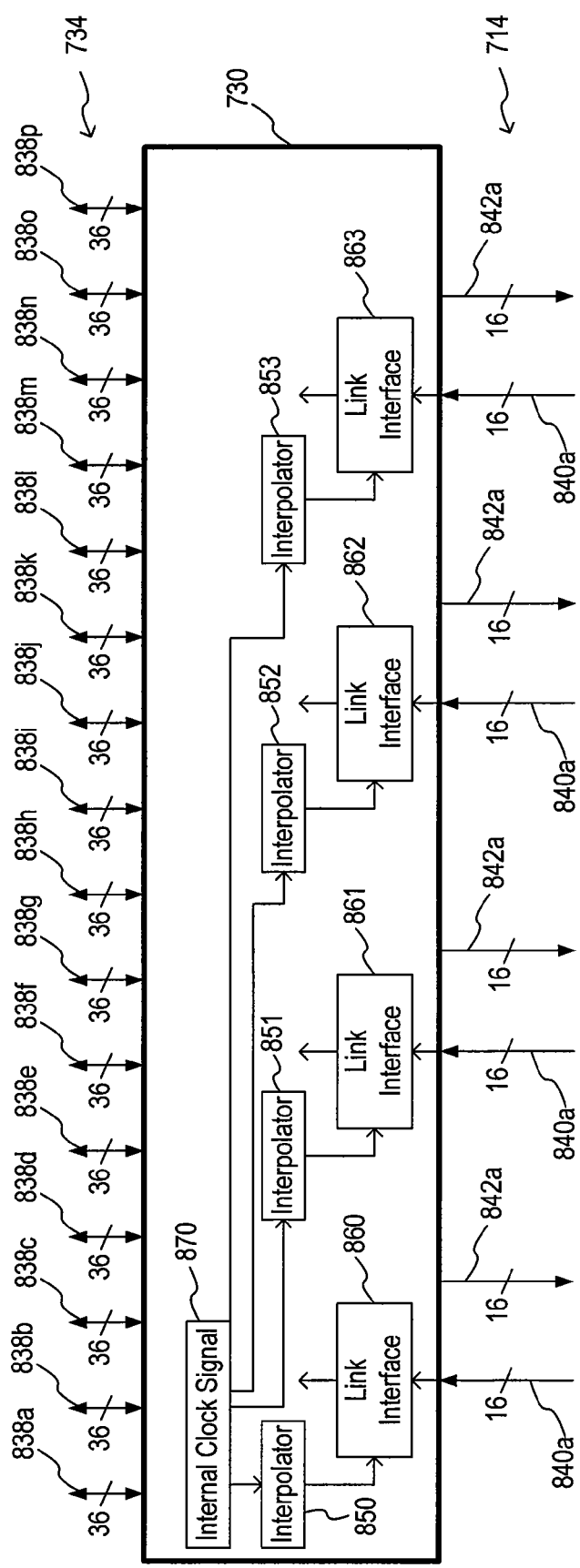
FIG. 8 is a schematic illustration of the logic die 730 of FIG. 7.

FIG. 8 is a schematic illustration of the logic die 730 of FIG. 7. The bus 734 may be divided into 16 36 bit bi directional sub buses 838*a-p*, with each of the 16 36 bit sub buses coupled to the 4 partitions in a respective vault. Each of these sub buses may communicate data between the logic die 730 and the memory die. The bus 714 connecting the processor 712 to the logic die 730 may be divided into 4 16 bit downstream lanes 840*a-d* and 4 separate 16 bit upstream lanes 842*a-d*. Link interfaces 860-863 may be provided, coupled to each of the 16-bit lanes of the bus 714. Link interfaces for the downstream lanes are shown. The link interfaces 860-863 may be configured to capture data from the downstream lanes. Interpolators 850-853 are coupled to the respective link interfaces 860-863 and may receive an internal clock signal 870 and provide clock signals having a programmable phase to the link interfaces for use in capturing the data signals received at the logic die 730. The data received at the logic die from the processor may have been generated, for example, by a clock signal at the processor, and will be captured using a different clock signal, such as the internal clock signal 870 generated on or received by the logic die 730. The interpolators 850-853 may function to adjust a phase of the clock signal used to capture the data, which may compensate for differences between the clock signals of, for example, the processor and the logic die 730. Each of the link interfaces 860-863 may further include a deserializer configured to deserialize 16 serial bits from one of the downstream lanes 840*a-d* to obtain 256 parallel data bits, which may be provided to one of the 43-bit sub buses 838*a-p* in a serial stream of 8 bits. The interpolators 850-853 may facilitate accurate capture of data from the processor and, therefore ultimately, to the memory die.

The computer system shown in FIG. 8 may be implemented in any of a variety of products employing processors and memory including for example cameras, phones, wireless devices, displays, chip sets, set top boxes, gaming systems, vehicles, and appliances. Resulting devices employing the memory system may benefit from the embodiments of interpolators described above to perform their ultimate user function.

From the foregoing it will be appreciated that, although specific embodiments of the invention have been described herein for purposes of illustration, various modifications may be made without deviating from the spirit and scope of the invention.

What is claimed is:

1. An interpolator system comprising:
   a first push-pull buffer configured to receive a first input clock signal having a first phase and output a first output clock signal having the first phase;
   a second push-pull buffer configured to receive a second input clock signal having a second phase and output a second output clock signal having the second phase; and
   a phase interpolator coupled to the first and second push-pull buffers, the interpolator configured to receive the first and second output clock signals and a control signal, the interpolator configured to generate a third output clock signal having a third phase corresponding to the control signal, wherein the third phase is equal to or between the first and second phases.

2. The interpolator system of claim 1, wherein the phase interpolator is configured to mix the first and second output clock signals.

3. The interpolator system of claim 1, wherein the first phase is 0 degrees and wherein the second phase is 90 degrees.

4. The interpolator system of claim 1, wherein the first and second input clock signals comprise respective differential input clock signals.

5. The interpolator system of claim 1, wherein the first push-pull buffer comprises a p-FET transistor and an n-FET transistor, wherein a drain terminal of the p-FET transistor is coupled to a drain terminal of the n-FET transistor, and wherein gate terminals of the p-FET and n-FET transistors are configured to receive the first input clock signal.

6. The interpolator system of claim 5, wherein the first input clock signal comprises differential first input clock signals, and wherein the p-FET and n-FET transistors are first p-FET and first n-FET transistors, respectively, the first push-pull buffer further comprising:
   a second p-FET transistor and a second n-FET transistor, wherein a drain terminal of the second p-FET transistor is coupled to a drain terminal of the second n-FET transistor, and wherein a source terminal of the first p-FET transistor is coupled to a source terminal of the second p-FET transistor, and wherein a source terminal of the first n-FET transistor is coupled to a source terminal of the second n-FET transistor, and wherein the gate terminals of the first p-FET and n-FET transistors are configured to receive one of the differential first input clock signals, and wherein gate terminals of the second p-FET and n-FET transistors are configured to receive another of the differential first input clock signals.

7. The interpolator system of claim 1, wherein the phase interpolator comprises:
   a third buffer configured to receive the first output clock signal;
   a fourth buffer configured to receive the second output clock signal; and
   a current source configured to receive the control signal and provide a programmable current to the third and fourth buffers in accordance with the control signal.

8. The interpolator system of claim 7, wherein the third and fourth buffers comprise at least a portion of respective push-pull buffers.

9. The interpolator system of claim 8, wherein the third and fourth buffers each include a respective p-FET and n-FET transistor.

10. The interpolator system of claim 7, wherein the phase interpolator further comprises:
    a fifth buffer configured to receive the first output clock signal and configured to generate a fourth output clock signal having a phase 180 degrees from the first phase; and
    a sixth buffer configured to receive the second output clock signal and configured to generate a fifth output clock signal having a phase 180 degrees from the second phase.

11. The interpolator system of claim 10, wherein the third and fifth buffers are configured to receive respective first control signals, and wherein only one of the third or fifth buffers are configured to be activated at a time responsive to the respective first control signals, and wherein the fourth and sixth buffers are configured to receive respective second control signals, and wherein only one of the fourth or sixth buffers are configured to be activated at a time responsive to the second control signals.

12. The interpolator system of claim 7, wherein the current source comprises:
    a first n-FET current mirror coupled to the third buffer;
    a first p-FET current mirror coupled to the third buffer;
    a second n-FET current mirror coupled to the fourth buffer; and
    a second p-FET current mirror coupled to the fourth buffer.

13. The interpolator system of claim 1, wherein the interpolator does not include a loading capacitor.

14. A phase interpolator comprising:
    a first input configured to receive a first clock signal having a first phase;
    a second input configured to receive a second clock signal having a second phase;
    a push-pull buffer coupled to the first input and configured to receive the first clock signal having a first phase;
    a programmable current mirror coupled to the push-pull buffer, wherein the programmable current mirror is configured to receive a control signal and provide a current to the push-pull buffer in accordance with the control signal; and
    an output coupled to the push-pull buffer and configured to generate an output clock signal having a third phase equal to or between the first and second phases.

15. The phase interpolator of claim 14, wherein the push-pull buffer is a first push-pull buffer, the programmable current mirror is a first programmable current mirror, and the control signal is a first control signal, the interpolator further comprising:
    a second push-pull buffer coupled to the second input and configured to receive the second clock signal having the second phase; and
    a second programmable current mirror coupled to the second push-pull buffer, wherein the second programmable current mirror is configured to receive a second control signal and provide a current to the second push-pull buffer in accordance with the second control signal.

16. The phase interpolator of claim 14, wherein the push-pull buffer comprises a p-FET transistor and an n-FET transistor, wherein a drain terminal of the p-FET transistor is coupled to a drain terminal of the n-FET transistor, and wherein gate terminals of the p-FET and n-FET transistors are configured to receive the first input clock signal.

17. The phase interpolator of claim 14, wherein the push-pull buffer is a first push-pull buffer, and wherein the phase interpolator further comprises a second push-pull buffer coupled to the first input, wherein the second push-pull buffer is configured to provide the first clock signal having the first phase to the first input.

18. An interpolator system, comprising:
a push-pull buffer configured to receive a first input clock signal having a first phase and output a first output clock signal having the first phase;
a phase interpolator coupled to the push-pull buffer and configured to receive the first output clock signal having the first phase and a second output clock signal having a second phase, wherein the phase interpolator is configured to mix the first output clock signal and the second clock signal to generate a third clock signal having a programmable phase.

19. The interpolator system of claim 18, wherein the programmable phase is equal to or between the first and second phases.

20. The interpolator system of claim 18, wherein the push-pull buffer comprises a p-FET transistor and an n-FET transistor, wherein a drain terminal of the p-FET transistor is coupled to a drain terminal of the n-FET transistor, and wherein gate terminals of the p-FET and n-FET transistors are configured to receive the first input clock signal.

21. The interpolator system of claim 18, wherein the push-pull buffer is a first push-pull buffer, the interpolator system further comprising a second push-pull buffer coupled to the phase interpolator, wherein the second push-pull buffer is configured to receive a second input clock signal and output the second output clock signal.

22. The interpolator system of claim 18, wherein the phase interpolator does not include a loading capacitor.

23. A memory system comprising:
a plurality of memory die;
a logic die stacked with the plurality of memory die, wherein the logic die comprises:
a link interface configured to capture data in accordance with a clock signal;
an interpolator system coupled to the link interface and configured to generate the clock signal, the at least one interpolator comprising:
a first push-pull buffer configured to receive a first input clock signal having a first phase and output a first output clock signal having the first phase;
a second push-pull buffer configured to receive a second input clock signal having a second phase and output a second output clock signal having the second phase; and
a phase interpolator coupled to the first and second push-pull buffers, the interpolator configured to receive the first and second output clock signals and a control signal, the interpolator configured to generate a third output clock signal having a third phase corresponding to the control signal, wherein the third phase is equal to or between the first and second phases.

24. The memory system of claim 23, wherein the logic die is configured to provide at least a portion of the captured data to the plurality of memory die using conductive through-wafer interconnects.

25. The memory system of claim 23, wherein the logic die further comprises a plurality of link interfaces and a plurality of interpolator systems, individual ones of the interpolator systems coupled to respective ones of the link interfaces.

26. A method for generating a clock signal having a programmable phase, the method comprising:
generating a first output clock signal having a first phase at a first push-pull buffer;
generating a second output clock signal having a second phase at a second push-pull buffer;
mixing the first and second output clock signals in accordance with a control signal to generate a third output clock signal having a phase between the first and second phases.

27. The method of claim 26, further comprising receiving a first input clock signal at gate terminals of a p-FET transistor and an n-FET transistor of the first push-pull buffer, wherein a drain terminal of the p-FET transistor is coupled to a drain terminal of the n-FET transistor.

28. The method of claim 26, wherein mixing the first and second output clock signals comprises providing an amount of current by a current source in accordance with the control signal.

29. The method of claim 28, wherein providing an amount of current from a current source comprises selecting an amount of current provided by a n-FET current mirror and a p-FET current mirror.

30. The method of claim 26, further comprising:
generating a fourth output clock signal based on the first output clock signal and having a phase 180 degrees from the first phase;
generating a fifth output clock signal based on the second output clock signal and having a phase 180 degrees from the second phase; and
selecting one of the first or fourth output clock signals;
selecting one of the second or fifth output clock signals; and
wherein the act of mixing the first and second output clock signals comprises mixing the selected output clock signals to generate the third output clock signal.

\* \* \* \* \*